(12) United States Patent
Gardner et al.

(10) Patent No.: US 6,603,180 B1
(45) Date of Patent: *Aug. 5, 2003

(54) SEMICONDUCTOR DEVICE HAVING LARGE-AREA SILICIDE LAYER AND PROCESS OF FABRICATION THEREOF

(75) Inventors: Mark I Gardner, Cedar Creek, TX (US); H. Jim Fulford, Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/980,380

(22) Filed: Nov. 28, 1997

(51) Int. Cl.$^7$ ................................................ H01L 29/76
(52) U.S. Cl. ................... 257/382; 257/215; 257/249; 257/262; 257/386; 257/486
(58) Field of Search ................. 257/380–385, 257/295, 411–413, 900; 438/762, 581–587, 299–305, 278–288, 592–595, 651–655

(56) References Cited

U.S. PATENT DOCUMENTS

| | | | | |
|---|---|---|---|---|
| 4,200,474 A | * | 4/1980 | Morris | 438/762 |
| 4,374,700 A | * | 2/1983 | Scott et al. | 438/586 |
| 4,717,684 A | * | 1/1988 | Katto et al. | 438/305 |
| 4,727,038 A | * | 2/1988 | Watabe et al. | 257/408 |
| 4,880,753 A | * | 11/1989 | Meakin et al. | 257/383 |
| 4,885,259 A | * | 12/1989 | Osinski et al. | 438/303 |
| 4,886,765 A | * | 12/1989 | Chen et al. | 438/586 |
| 5,028,554 A | * | 7/1991 | Kita | 257/384 |
| 5,091,763 A | * | 2/1992 | Sanchez | 257/900 |
| 5,134,451 A | * | 7/1992 | Katoh | 257/384 |
| 5,444,282 A | * | 8/1995 | Yamaguchi et al. | 257/384 |
| 5,491,099 A | * | 2/1996 | Hsu | 437/35 |
| 5,523,964 A | * | 6/1996 | McMillan et al. | 257/295 |
| 5,571,736 A | * | 11/1996 | Paterson et al. | 438/262 |
| 5,572,052 A | * | 11/1996 | Kashihara et al. | 257/295 |
| 5,610,430 A | * | 3/1997 | Yamashita | 257/412 |
| 5,705,417 A | * | 1/1998 | Tseng | 437/44 |
| 5,828,080 A | * | 10/1998 | Yano et al. | 257/43 |
| 5,943,596 A | * | 8/1999 | Gardner et al. | 438/585 |
| 5,946,581 A | * | 8/1999 | Gardner et al. | 438/307 |
| 6,020,024 A | * | 2/2000 | Maiti et al. | 427/248.1 |

FOREIGN PATENT DOCUMENTS

JP 363284857 A * 11/1988 ................. 257/412

OTHER PUBLICATIONS

S. Wolf, "Contact Technology and Local Interconnects for VLSI", Silicon Processing for the VLSI Era–vol. II, pp. 143–153, 157–158 (1990).

* cited by examiner

Primary Examiner—Long Pham
Assistant Examiner—Wai-Sing Louie

(57) ABSTRACT

A semiconductor device having a large-area silicide layer and fabrication method is provided. A semiconductor device, consistent with one embodiment of the invention, includes a silicon substrate, a gate insulating layer disposed over the silicon substrate, a gate electrode disposed over the gate insulating layer, and at least one active region disposed adjacent the gate electrode. Formed over the active region and in contact with the insulating layer is a silicide layer. The active region may, for example, be a source/drain region. The silicide layer generally has a surface area which is larger than that of conventional silicide layers. This, for example, reduces the resistance of the active regions of the semiconductor device and enhances device performance.

19 Claims, 5 Drawing Sheets

SEMICONDUCTOR DEVICE HAVING LARGE-AREA SILICIDE LAYER AND PROCESS OF FABRICATION THEREOF

FIELD OF THE INVENTION

The present invention generally relates to semiconductor devices and, more particularly, to a semiconductor device having a large-area silicide layer and a process for fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In a completed device structure, a silicidation layer 111 is typically formed over the source/drain regions 105 and the gate electrode 103. The silicidation layer 111 generally facilitates contact between the gate electrode 103 and source/drain regions 105 and subsequent metal lines. The silicidation layer 111 also serves to reduce the sheet resistance of the gate electrode 103 and source/drain regions 105.

The silicidation layer 111 is typically formed by forming spacers 113 on sidewalls of the gate electrode 203, depositing a layer of metal, such as tungsten or cobalt, over the substrate 101 and annealing the wafer. During the annealing process, the deposited metal reacts with underlying silicon and forms a metal silicidation layer. The silicidation layer 211 generally expands outward from the original surface of the underlying silicon. The spacers 113 play an important role in separating the silicidation layer 111 over the source/drain regions 105 from the silicidation layer 111 on the gate electrode 103. Without the spacers 113, conventionally formed silicidation layers would short the source/drain regions 105 and the gate electrode 103. A more detailed description of silicidation layers and the fabrication thereof may be found in S. Wolf, Silicon Processing for the VLSI Era, Vol. 2: Processing Integration, pp. 143–153 and 157–158.

SUMMARY OF THE INVENTION

The present invention generally relates to a semiconductor device having a large-area silicide layer. The silicide area generally has a surface area which is larger than silicide layers formed using conventional techniques. This, for example, reduces the resistance of the active regions of the semiconductor device and enhances device performance.

In accordance with one embodiment of the invention, a process for fabricating a semiconductor device is provided in which a gate insulating layer is formed over a silicon substrate. A gate electrode is formed over the gate insulating layer. A silicide layer is formed over an active region of the substrate adjacent the gate electrode and in contact with the gate insulating layer. The silicide layer may, for example, have a height which is less than the thickness of the gate insulating layer. The active region may, for example, be a source/drain region.

A semiconductor device, consistent with one embodiment of the invention, includes a silicon substrate, a gate insulating layer disposed over the silicon substrate, a gate electrode disposed over the gate insulating layer, and at least one active region disposed adjacent the gate electrode. Formed over the active region and in contact with the insulating layer is a silicide layer. The active region may, for example, be a source/drain region.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
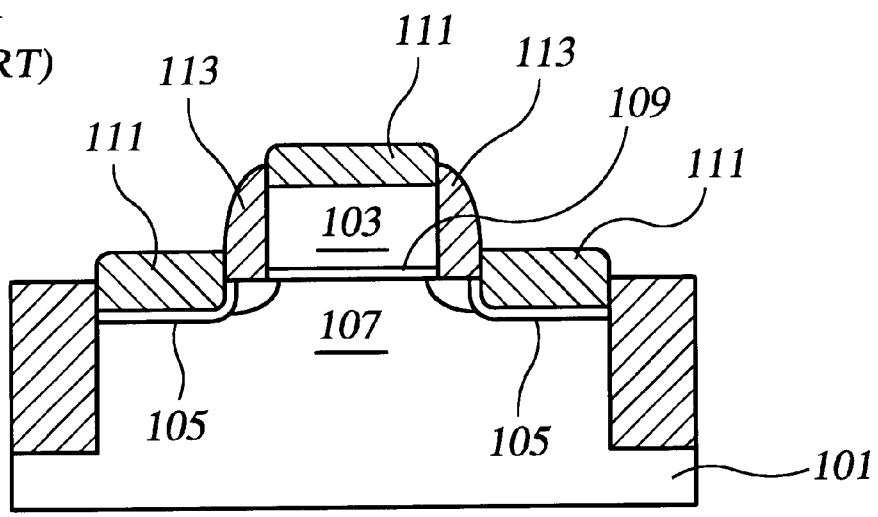
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices having silicidation layers.

The invention is believed to be particularly beneficial in MOS structures, such as PMOS, NMOS, CMOS, and BiCMOS transistors. While the present invention is not so limited, an appreciation of various aspects of the invention will be gained through a discussion of the fabrication process and characteristics of such a device in connection with the examples provided below.

Figure 2A:
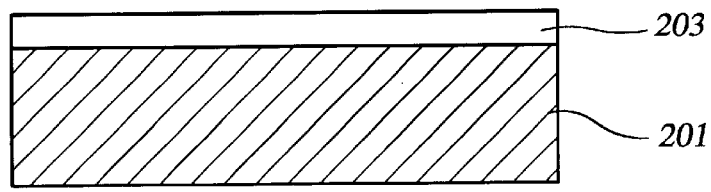
FIGS. 2A–2F illustrate an exemplary process in accordance with one embodiment of the invention.

FIGS. 2A–2F illustrate an exemplary process for forming a large-area silicidation or silicide layer over an active region of a semiconductor device. Consistent with this exemplary process, a relatively thick gate insulating layer 203 is formed over a silicon substrate 201. The resultant structure is illustrated in FIG. 2A. The gate insulating layer 203 may be formed from a number of different dielectric materials and may be formed over the substrate 201 using a number of different techniques, including, for example, well-known deposition techniques.

The gate insulating layer 203 will be used to insulate a gate electrode from the substrate 201. In accordance with the invention, the gate insulating layer 203 will also be used to separate the gate electrode from a silicide layer which will be formed over active regions of the substrate 201 adjacent the gate electrode. The thickness of the gate insulating layer 203 is suitably selected to provide the desired separation between the gate electrode and the silicide layer. Suitable thicknesses for the gate insulating layer typically exceed 300 ansgstroms (Å), and depending on the type of dielectric material used, typically range from about 300–1000 Å or more for many applications.

As noted above, the gate insulating layer 203 may be formed of a number of different dielectric materials. Moreover, the gate insulating layer 203 may be formed from a single dielectric material or may be a composite layer including two or more dielectric layers. Typically, the gate insulating layer 203 is formed (at least in part) from a dielectric material which has a higher dielectric constant (i.e., permittivity) than silicon dioxide, which has a permittivity or dielectric constant of about 4. This allows the gate insulating layer 203 to have a much greater thickness while still providing similar capacitive characteristics as a thin layer of silicon dioxide. For example, 300 Å of a dielectric material having a dielectric constant of 50 is equivalent to about 25 Å of silicon dioxide (i.e., 300 Å of the dielectric material has an equivalent silicon dioxide thickness of about 25 Å).

Suitable high permittivity materials that may be used for the gate insulating layer 203 include, for example, barium strontium titanate (BST), tantalum oxide $Ta_xO_y$, lead zirconate titanate (PZT), or lead lanthanum zirconate titanate (PLZT). The present invention, however, is not so limited. Other dielectric materials including, for example, other high-permittivity materials as well as silicon dioxide may be used if desired. More details of the formation of relatively thick gate insulating layers using high permittivity dielectrics may be found in U.S. patent application Ser. No. 08/920,384, entitled "SEMICONDUCTOR DEVICE HAVING HIGH PERMITTIVITY GATE INSULATING LAYER AND METHOD OF MANUFACTURE THEREOF," filed Aug. 29, 1997, commonly owned by and assigned to the assignee of the present application, the contents of which are herein incorporated by reference.

Figure 2B:
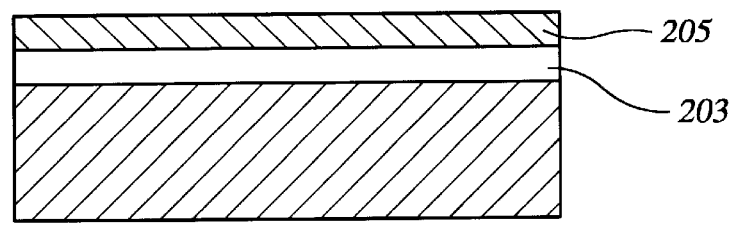

A gate electrode layer 205 is formed over the gate insulating layer 203, as illustrated in FIG. 2B. The gate electrode layer 205 will be used to form a gate electrode and may be formed of polysilicon or a metal, for example. In the example embodiment, the gate electrode layer 205 is formed from polysilicon. A polysilicon gate electrode layer 205 may be formed using, for example, well-known deposition techniques. While the present invention is not so limited, suitable thicknesses for a polysilicon gate electrode layer 205 may range from about 1000 to 2000 Å for many applications.

Figure 2C:
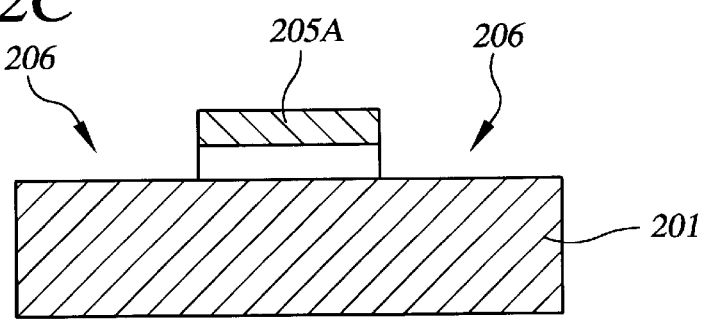
Figure 2D:
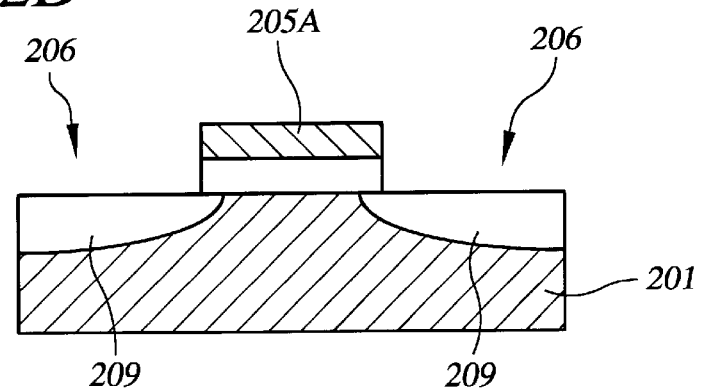

Portions of the gate electrode layer 205 and gate insulating layer 203 are removed to form one or more gate electrodes (only one of which is shown) over the substrate 201. The resultant structure is illustrated in FIG. 2C. Removal of portions of the gate electrode layer 205 and gate insulating layer 203 to form the gate electrode 205A may be performed using, for example, well-known photolithography and etching techniques. Portions of the semiconductor substrate 201 which lie adjacent the gate electrode 205A generally define active regions 206 of the substrate 201. As used herein, the term active region encompasses a region where an active portion (e.g., source or drain) of the device resides whether the active portion has been or will be formed.

The active regions 206 of the substrate 201 adjacent the gate electrode 205a are doped with a dopant to form source/drain regions 209 within the substrate 201. The source/drain regions 209 may be formed using, for example, a number of known techniques. The source/drain regions 209 may, for example, be formed by implanting a dopant into the substrate 201 using the gate electrode 205a for alignment. The type of dopant used to form the source/drain regions 209 typically varies depending on the type of device (e.g., PMOS or NMOS) being formed. In NMOS devices, an n-type dopant such as arsenic or phosphorus is typically used. In PMOS devices, a p-type dopant such as boron is typically used.

Figure 2E:
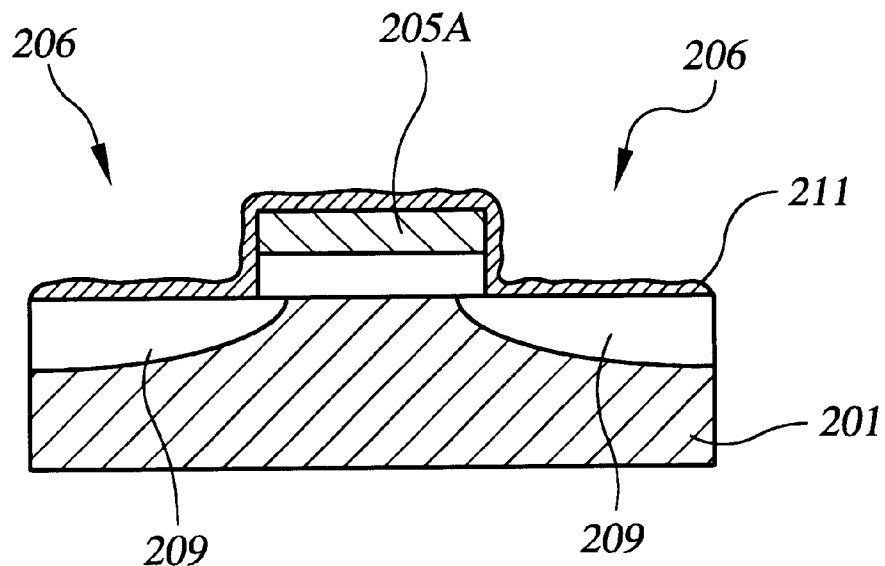

A layer of metal 211 is formed of the substrate 201, as illustrated in FIG. 2E. The metal layer 211 may be formed using a number of different techniques, including, for example, well-known deposition techniques. The metal layer 211 will be reacted with portions of the underlying silicon substrate 201 (as well as the gate electrode if formed of polysilicon) to form a silicide layer over the source/drain regions 209. The thickness of the metal layer is suitably selected in consideration of the desired thickness of the silicide layer, taking into account the type of metal used and the consumption rate of silicon. Suitable thicknesses of the metal layer 211 range from about 50 to 200 Å for many applications. A number of different metals may be used for the metal layer 211. Suitable metals include, for example, tungsten, nickel, titanium, and cobalt.

The substrate 201 (as well the layers thereon) is then typically heated to react the metal layer 211 with the silicon substrate 201 to form silicide layers 213 over the source/drain regions 209. Where the gate electrode $205_a$ is formed of the polysilicon, a silicide layer 215 is also formed over the exposed surfaces of the gate electrode $205_a$. The thickness of the silicide layers 213 is dependent upon the type of metal used and its consumption rate of polysilicon. Typical consumption rates range from about 1.5 to 2.5 parts polysilicon for every part metal. The resultant silicide layer typically has a thickness about equal to or a little greater than the amount of polysilicon consumed. Accordingly, using 50 to 200 Å of metal typically provides a silicide layer thickness of about 75 to 500 Å.

The invention is not limited to the exemplary metal layer thicknesses and silicide layer thicknesses discussed above. What is important is that the amount of metal used and resultant silicide layer thickness are selected to provide a silicide layer having a height relative to the substrate surface which is less than the thickness of the gate insulating layer.

Figure 2F:
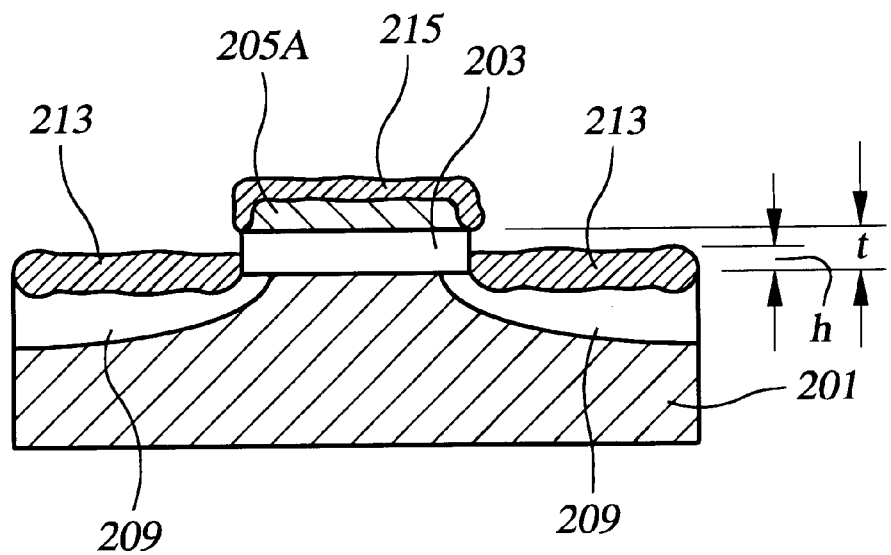

After the silicide layers 213 (and 215) have been formed, any unreacted portions of the metal layer 211 are removed using, for example, well-known etching techniques. The resultant structure is illustrated in FIG. 2F. Fabrication of the semiconductor device may continue with well-known fabrication steps, such as contact formation, and so forth to form the ultimate device structure.

The temperature and time allowed for the silicide reaction process can vary depending on the type and amount of metal used and the desired thickness of the silicide layers 213. In one example embodiment, the metal layer 211 is reacted with polysilicon by annealing the substrate at about 700° C. for 30 to 60 seconds using, for example, a rapid thermal anneal process. The water is then cleaned of any unreacted metal and any non-silicide metal compositions (e.g., metal-nitrides, etc.) A final anneal at about 800° C. is performed to further reduce the resistivity of the silicide layers. The last anneal is optional and may be omitted if desired.

The resultant structure illustrated in FIG. 2F generally includes silicide layers 213 which are formed over source/drain regions 209. Each silicide layer 213 generally has a height h which is less than the thickness t of the gate insulating layer 203. Moreover, each silicide layer 213 is in contact with (i.e., abuts) the gate insulating layer 203. As should be appreciated, the depth of the silicide layers 213 is shallower than the source/drain junction in order to prevent shorting of the source/drain junction. The silicide layer 215 over the gate electrode 205A generally extends over the top surface of the gate electrode 205A as well as the sidewalls of the gate electrode 205A. It should be noted that where a metal is used for the gate electrode 205A, a silicide layer 215 typically will not form thereon.

Using the above process, a large-area silicide layer may be formed over an active region of the semiconductor device. The silicide layer may, for example, extend to directly contact a gate insulating layer. This provides a silicide layer which has an increased surface area as compared to silicide layers formed using conventional techniques (e.g., conventional silicide layers are typically buffered from a gate insulating layer by spacers as shown in FIG. 1). The large-area silicide layer reduces the effective resistance of the source/drain regions and enhances device performance by, for example, increasing the drive current of the device.

The above process can be used to form a number of different semiconductor devices including but not limited to, MOS structures such as p-type MOS devices (PMOS), n-type MOS devices (NMOS), and complementary MOS (CMOS) semiconductor devices having both PMOS and NMOS devices. Moreover, the above process can be used to form lightly doped drain (LDD) structures. FIGS. 3A–3E and 4A–4D illustrate further embodiments of the invention in which large-area silicide layers are integrated with the formation of LDD source/drain structures.

Figure 3A:
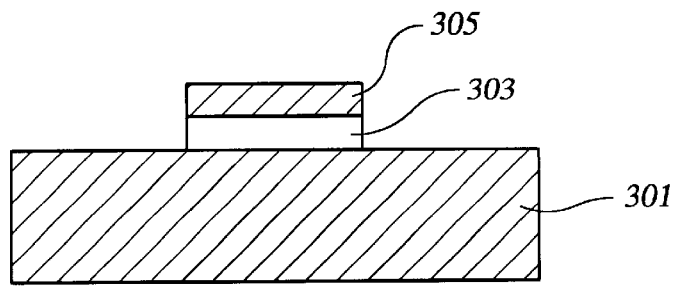
FIGS. 3A–3E illustrate an exemplary process in accordance with another embodiment of the invention.
Figure 3B:
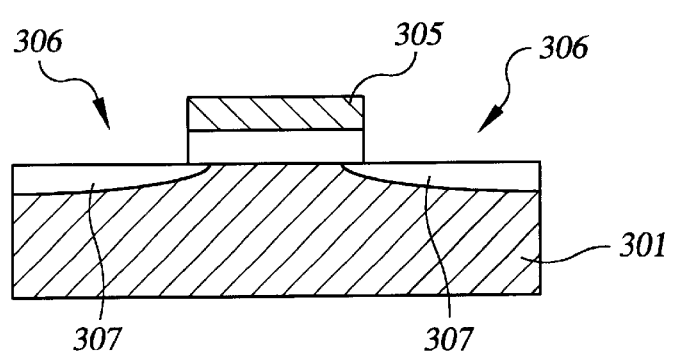

In accordance with the exemplary process of FIGS. 3A–3E, a gate insulating layer 303 is formed over a silicon substrate 301 and a gate electrode 305 is formed over the gate insulating layer 303. While only one gate electrode is shown, it should be appreciated that typically a large number of gate electrodes are formed over the substrate 301. The gate electrode 305 and gate insulating layer 303 may be formed in a similar manner as discussed above with respect to FIGS. 2A–2C. The resultant structure is illustrated in FIG. 3A.

Active regions 306 of the substrate adjacent the gate electrode 305 are doped to form lightly doped regions 307 and substrate 301. The lightly doped regions 307 will be used to form LDD source/drain structures. The lightly doped regions 307 may be formed using a number of known techniques. In one particular embodiment, the lightly doped regions 307 are formed by implanting a dopant into the substrate 301 using the gate electrode for alignment. The type of dopant (n-type or p-type) which is implanted typically varies depending on the type of device being formed.

Figure 3C:
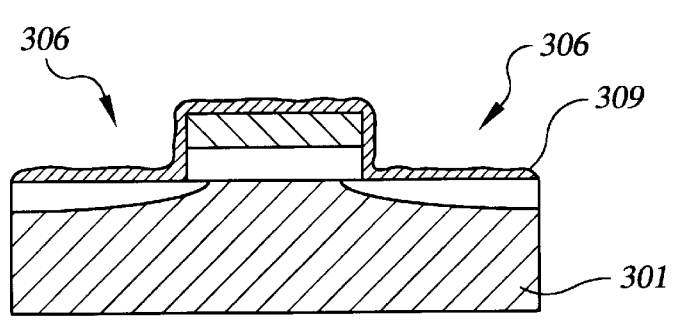

A metal layer 309 is formed over the substrate 301, as illustrated in FIG. 3C. The metal layer 309 will be used to form a silicide layer over the active regions 306, as will be discussed below. The characteristics and formation of the metal layer 309 may be similar to those of the metal layer 211 discussed above.

Figure 3D:
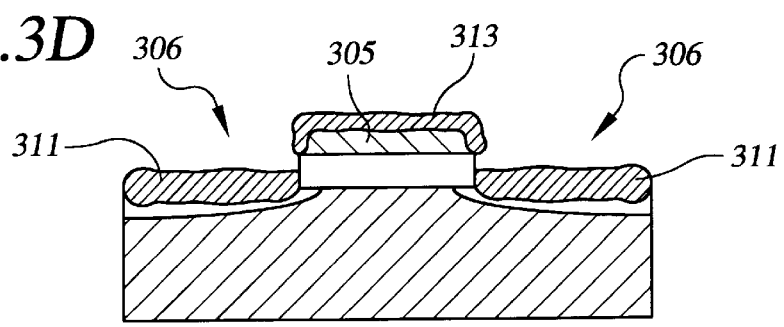
Figure 3E:
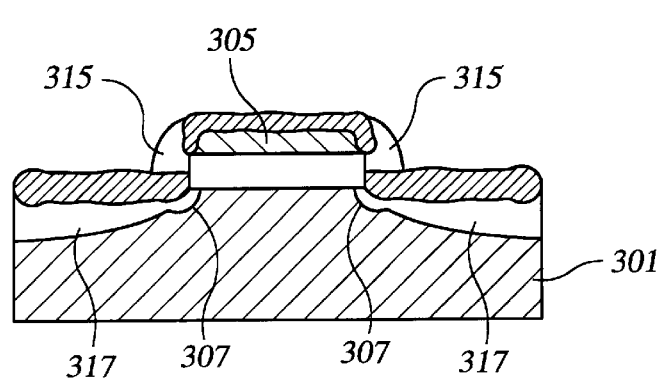

Using the metal layer 309, silicide layers 311 are formed over the active regions 306 of the substrate 301. Where the gate electrode 305 is formed of polysilicon, a silicide layer 313 is also formed on exposed surfaces of the gate electrode 305. The resultant structure is illustrated in FIG. 3D. The silicide layers 311 and 313 may, for example, be formed in a similar manner as discussed above with respect to FIG. 2F. The silicide layers 311 are typically shallower than the junction of the lightly-doped regions 307.

Spacers 315, typically formed from an oxide such as silicon dioxide, are formed on sidewalls of the gate electrode 305. The spacers 315 are generally formed over the silicide layers 311 and adjacent a portion of the silicide layer 313 which lies on a sidewall of the gate electrode 305. The spacers 315 may be formed using, for example, well-known techniques. Using the spacers 315 for alignment, a relatively high dose of a dopant is implanted into the substrate 301 to form heavily doped regions 317 in the substrate 301. The resultant structure is illustrated in FIG. 3D. Together, the heavily doped regions 317 and lightly doped regions 307 form LDD source/drain structures.

Figure 4A:
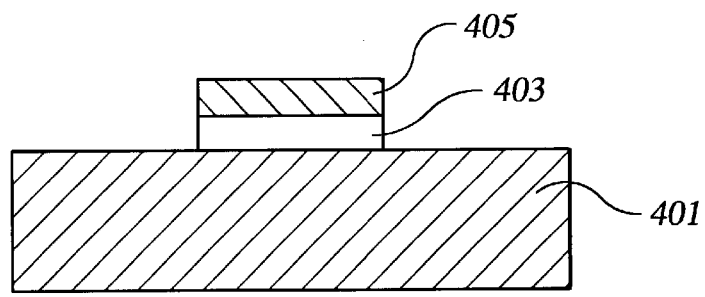
FIGS. 4A–4D illustrate an exemplary process in accordance with yet another embodiment of the invention.

FIGS. 4A–4D illustrate another exemplary process for forming a large-area silicide layer over an LDD source/drain structure. In accordance with this exemplary process, a gate insulating layer 403 is formed over a silicon substrate 401 and a gate electrode 405 is formed over the gate insulating layer 403. While only one gate electrode is shown, it should be appreciated that typically a large number of gate electrodes are typically formed over the substrate 401. The gate electrode 405 and gate insulating layer 403 may be formed in a similar manner as discussed above with respect to FIGS. 2A–2C. The resultant structure is illustrated in FIG. 4A.

Figure 4B:
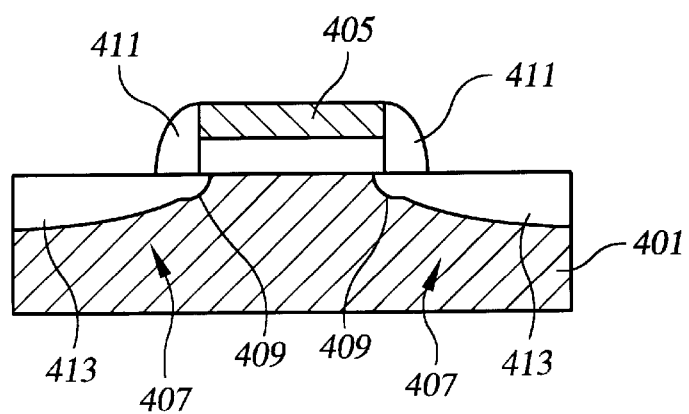

LDD source/drain structures 407 are then formed in active regions of the substrate 401 adjacent the gate electrode 405. The resultant structure is illustrated in FIG. 4B. In the exemplary embodiment, the LDD source/drain structures 407 are formed by implanting a low dose of a dopant to the substrate 401 using the gate electrode 405 for alignment. This implant forms lightly doped regions 409 in the substrate 401. Spacers 411 are then formed on sidewalls of the gate electrode 405 using well-known techniques. A relatively high dose of a similar dopant is implanted into the substrate 401 using the spacers 415 for alignment. This implant forms heavily doped regions 413 in the substrate 401. The heavily doped regions 413 and lightly doped regions 409 together form LDD structures 407.

Figure 4C:
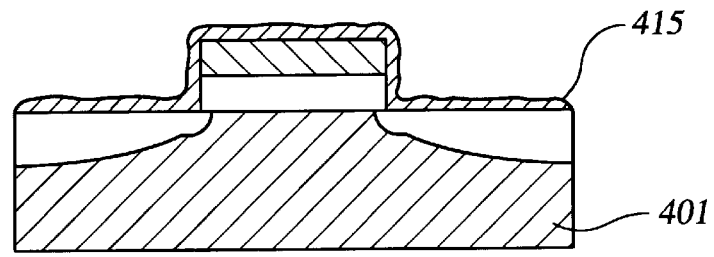

A metal layer 415 is formed over the substrate 401, as illustrated in FIG. 4C. The metal layer 415 will be used to form a silicide layer over the active regions, as will be discussed below. The characteristics and formation of the metal layer 415 may be similar to those of the metal layer 211 discussed above.

Figure 4D:
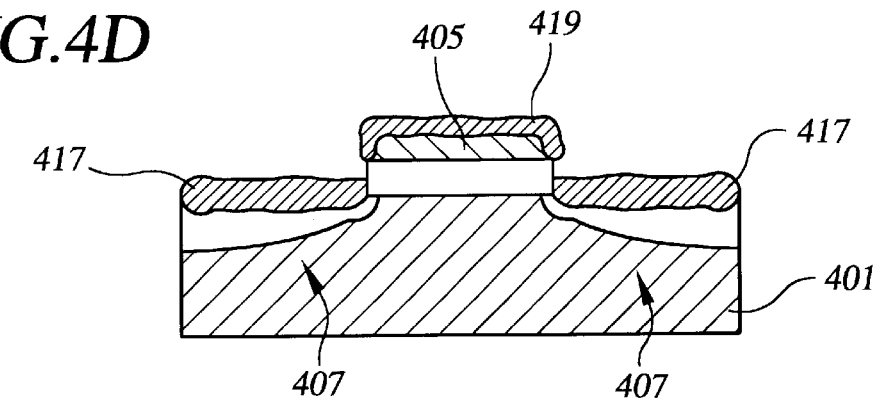

Using the metal layer 415, silicide layers 417 are formed over the active region of the substrate 401. Where the gate electrode 405 is formed of polysilicon, a silicide layer 419 is also formed on exposed surfaces of the gate electrode 405. The resultant structure is illustrated in FIG. 4D. The silicide layers 417 and 419 may, for example, be formed in a similar manner as discussed above with respect to FIG. 2F. The silicide layers 417 are typically shallower than the junctions of the LDD source/drain structures 407.

Using the exemplary processes illustrated in FIGS. 3A–3E and FIGS. 4A–4D, a large-area silicide layer may be formed over LDD source/drain structures. The silicide layer may, for example, extend over lightly-doped regions of the LDD source/drain structures to directly contact a gate insulating layer. This provides a silicide layer which has an increased surface area as compared to silicide layers formed using conventional techniques (e.g., conventional silicide layers are typically buffered from a gate insulating layer by spacers as shown in FIG. 1). The large-area silicide layer reduces the effective resistance of the source/drain regions and enhances device performance by, for example, increasing the drive current of the device.

As noted above, the present invention is applicable to the fabrication of a number of different devices which benefit from the formation of large-area silicidation layers. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of fabricating a semiconductor device, comprising:

forming a gate insulating layer of a first thickness over a substrate;

forming a gate electrode over the gate insulating layer;

implanting a dopant and forming lightly doped regions in the substrate;

forming a metal layer over the substrate; and forming silicide on and extending over the gate electrode and over an active region of the substrate adjacent the gate electrode and extending from the gate electrode to be in contact with the gate insulating layer, the silicide having a thickness less than the first thickness.

2. The process of claim 1, wherein the silicide is formed in one step.

3. The process of claim 1, wherein forming silicide includes forming silicide extending from over the active region of the substrate adjacent the gate electrode to be in contact with the gate insulating layer.

4. The process of claim 1, wherein the gate insulating layer is formed from a dielectric material having a permittivity greater than 20.

5. The process of claim 1, wherein the gate insulating layer is formed from BST.

6. The process of claim 1, wherein the gate insulating layer is formed from PLZT.

7. The process of claim 1, wherein forming silicide includes forming silicide on sidewalls of the gate electrode.

8. The process of claim 1, further including doping the active region to form a source/drain region in the active region prior to forming silicide.

9. The process of claim 1, further including:

doping the active region to form a lightly-doped region in the active region prior to forming silicide;

forming a spacer on a sidewall of the gate electrode after forming silicide; and doping the active region to form a heavily-doped region in the active region after forming the spacers.

10. The process of claim 1, further including:

forming an LDD source/drain structure using a spacer prior to forming silicide; and removing the spacer prior to forming silicide.

11. The process of claim 1, wherein forming the silicide includes reacting portions the metal layer with the substrate and gate electrode to form the silicide.

12. The process of claim 11, further including removing unreacted portions of the metal layer.

13. The process of claim 1, wherein forming silicide includes forming silicide having a uniform thickness.

14. The process of claim 2, wherein forming silicide includes forming silicide having a uniform thickness.

15. The process of claim 1, wherein forming silicide on and extending over the gate electrode includes forming silicide touching the gate insulating layer.

16. The process of claim 1, wherein forming silicide over an active region of the substrate includes forming silicide touching the gate insulating layer.

17. The process of claim 1, wherein forming silicide over an active region of the substrate includes forming silicide touching the gate insulating layer.

18. The process of claim 17, wherein the silicide over the active region of the substrate and on and extending over the gate electrode do not touch each other.

19. A process of fabricating a semiconductor device, comprising:

forming a gate insulating layer over a substrate;

forming a gate electrode over the gate insulating layer;

implanting a dopant and forming lightly doped regions in the substrate;

forming a metal layer over the substrate; and forming silicide on and extending over the gate electrode and over an active region of the substrate adjacent the gate electrode, the silicide in contact with the gate insulating layer from a first silicide formation along side walls of the gate electrode and from a second silicide formation over the active region of the substrate adjacent the gate electrode.

* * * * *